United States Patent [19]
Väisänen et al.

[11] Patent Number: 5,152,004
[45] Date of Patent: Sep. 29, 1992

[54] PROCEDURE FOR FORMING LOW POWER LEVELS IN A RADIO TELEPHONE TRANSMITTER

[75] Inventors: Risto Väisänen; Jukka Sarasmo; Vesa Pekkarinen, all of Salo, Finland

[73] Assignee: Nokia Mobile Phones Ltd., Salo, Finland

[21] Appl. No.: 516,762

[22] Filed: Apr. 30, 1990

[30] Foreign Application Priority Data

May 12, 1989 [FI] Finland ................ 892314

[51] Int. Cl.⁵ ............................. H04B 1/04
[52] U.S. Cl. ..................... 455/68; 455/127; 330/284
[58] Field of Search ........ 455/68, 69, 98, 135, 455/127; 330/279, 284, 151, 295, 124 R, 278; 375/60; 379/63

[56] References Cited
U.S. PATENT DOCUMENTS

| | | | |
|---|---|---|---|
| 4,392,245 | 7/1983 | Mitama | 455/115 |
| 4,439,744 | 3/1984 | Kumar et al. | 330/284 |
| 4,523,155 | 6/1985 | Walczak et al. | 330/279 |
| 4,560,949 | 12/1985 | Young | 330/284 |
| 4,646,036 | 2/1987 | Brown | 330/284 |
| 4,754,231 | 6/1988 | Sawa | 330/279 |
| 4,985,686 | 1/1991 | Davidson et al. | 330/124 R |
| 4,992,753 | 2/1991 | Jenson et al. | 455/126 |

FOREIGN PATENT DOCUMENTS

3742270C1 12/1987 Fed. Rep. of Germany .

OTHER PUBLICATIONS

JP-A-60 121 830 (Matsushita) dated Jun. 29, 1985, Patent Abstract of Japan, vol. 9, No. 277 (E-355)(2000), Nov. 6, 1985, 1 page.
JP-A-60 019310 (Nippon Denki) dated Jan. 31, 1985, Patent Abstract of Japan, vol. 9, No. 136 (E320)(1859), Jun. 12, 1985, 1 page.

Primary Examiner—Reinhard J. Eisenzopf
Assistant Examiner—Edward Urban
Attorney, Agent, or Firm—Darby & Darby

[57] ABSTRACT

A circuit for forming low power levels in a radio telephone transmitter in which high power levels are produced in a controllable amplifier stage (1), for instance in a class-C power amplifier. According to the procedure, a RF signal is before the amplifier stage (1) divided into two branches in a power divider (4), in one of which the Rf signal is conducted to said amplifier stage (1) for forming high power levels, and in the other branch the RF signal is conducted to an element (5) by which low power levels are produced, and said branches are combined in the output (RFout) of the transmitter. The element (5) may be a PIN diode attenuator.

11 Claims, 1 Drawing Sheet

PROCEDURE FOR FORMING LOW POWER LEVELS IN A RADIO TELEPHONE TRANSMITTER

BACKGROUND OF THE INVENTION

1. Field of the Invention

The present invention concerns a circuit by which in a transmitter, consisting of a controlled amplifier of one or several stages, the lowest power levels can be formed and used with good efficiency.

2. Discussion of Related Art

In a transmitter of a radio telephone, class-C amplifiers are generally used, which are characterized by good efficiency, 60 to 80 percent, at high power levels. Because of the great non-linearity of the class-C-type amplifier, difficulties arise in realizing control of the amplifier at low power levels, and in addition, when lower power levels are used, the efficiency of the amplifier is reduced. This causes no harm when a system (or a locality of use) is in question in which the smallest transmission power levels need not be used. The situation will be different, for instance in the digital GMS system covering in future all Europe, in which very low power levels will be in use. If a telephone is going to be used in an airplane, it is necessary to use a low power level in order to prevent potential interference with the aviational electronics. Consequently, probably the lowest power levels, on the order of $-17$ dBm order of magnitude, will have to be used.

A typical prior art principle block diagram of a transmitter for a GSM radio telephone is presented in FIG. 1. The block diagram only shows the blocks required for understanding the operation. A signal to be transmitted enters the input RFin of a three-stage class-C-type power amplifier. The gain of the amplifier 1 is controlled by a reference amplifier 3, the output of which is filtered before being input in the power amplifier 1. The input signals of the reference amplifier 3 are the voltage derived from a power detector 2, said voltage being proportional to the output voltage RFout of the power amplifier 1, and the control voltage TXC1 derived from the logic section of the telephone. Said blocks 1, 2 and 3 constitute a control loop, which tends to be controlled in a state such that the voltage to be derived from the power detector 2 and the control voltage TXC1 derived from the logic sections of the radio telephone are of equal magnitude.

With the circuitry of the prior art, power levels are obtainable which extend from the maximum level down to about 25 dB below the maximum power level. If a wider power control range is wished, the following difficulties arise: the narrowness and non linearity of the dynamic range of the power detector and the poor controllability of a power amplifier of the class-C-type make the control of low power levels difficult. On small power levels, the efficiency of the amplifier is extremely poor. According to the specifications of the GSM system, the power increase will on low power levels conform to the $COS^2$ graph and this is difficult with a class-C amplifier.

SUMMARY OF THE INVENTION

The object of the present invention is to produce a procedure with which, when using a class-C amplifier, small power levels may, nevertheless, be generated controllably and with good efficiency.

The invention is characterized in that a radio frequency (RF) signal is divided prior to the amplifying stage into two branches in a power divider, in one of which the RF signal is conducted into the amplifier stage for generating high power levels, and in the other branch the RF signal is conducted to an element with which low power levels are produced, and said branches being combined in the output of the transmitter.

According to the circuit, a RF signal is conducted into two branches, a first thereof being intended for high power levels. In said first branch the signal is amplified in a manner known in the art in a control loop including a class-C power amplifier.

The other branch is intended to be used when extremely low power levels of a transmission signal are needed. In said second branch the signal level may be attenuated as desired by means of an appropriate attenuator. The maximum power level is obtained from said branch when the attenuation is zero, and as the attenuation is raised, power level will no doubt be reduced.

BRIEF DESCRIPTION OF THE DRAWINGS

The circuit of the invention is described below more in detail, reference being made to the annexed figures, in which.

DESCRIPTION OF THE PREFERRED EMBODIMENT

Figure 1:
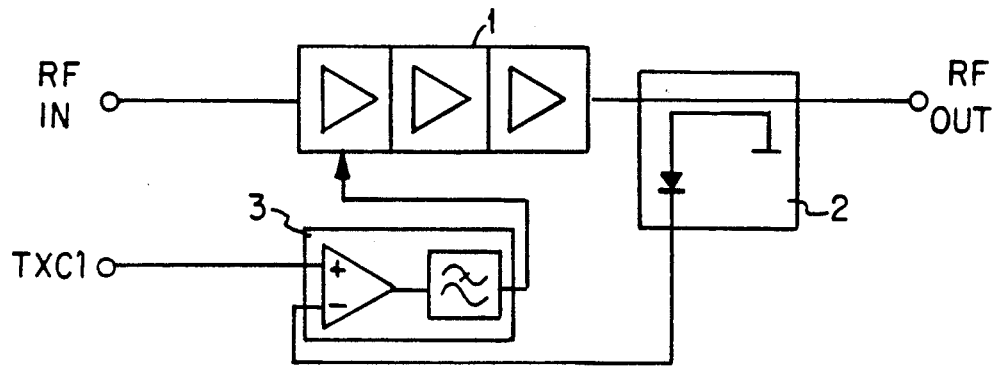
FIG. 1 presents prior art block diagram of the transmitter of a GSM radio telephone.

FIG. 1 presents a prior art transmitter of a radio telephone, the functioning of which has already been described above. For the power detector 2, for instance, a diode detecting element may be used.

Figure 2:
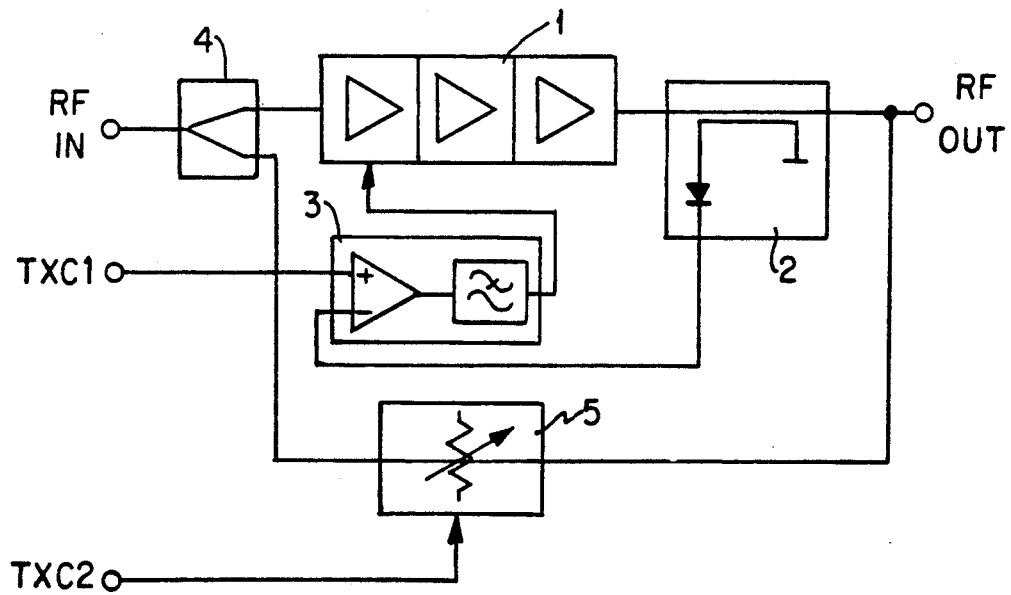
FIG. 2 presents the principle block diagram of the GSM radio telephone used in the circuit according to the invention.

As taught by the invention, a radio frequency (RF) control signal is divided in the manner shown in FIG. 2 into two branches in a power divider 4. The power divider may be realized using any method known in the art. The simplest arrangement is to have a divider with three resistors. After leaving the power divider 4, the Rf signal proceeds both to the branch in which it is amplified as in the prior art (FIG. 1), and to the branch in which it is attenuated. An expedient attenuator for this purpose is a voltage controlled PIN diode attenuator 5. The attenuator 5 is controlled by a control signal TXC2 obtained from the logic section of the radio telephone. From the PIN diode attenuator, the signal is conducted into the output RFout of the transmitter.

The transmitter of the radio telephone operates in accordance with the invention, in the following manner. On high power levels, the transmitter functions like a conventional class-C amplifier shown in FIG. 1. The amplifier 1 is conducted with a control TXC1. The control TXC2 of the PIN diode attenuator 5 is not in use, and the attenuation of the attenuator 5 in the state of operation is maximal; therefore, a signal transmitted therethrough, while in the output RFout, is insignificant compared with the amplified RF signal emitted from the amplifier 1. Such power levels may be achieved which are about 25 dB below the maximum power rate. If below $+13$ dBm power rates are desired to be produced, the control TXC1 is not used, but the control takes place with the aid of the voltage TXC 2 by which the attenuation of the PIN diode attenuator 5 is controlled. Hereby, the power amplifier 1 is not at all in use but the signal passes through the attenuator 5, bypassing the power amplifier 1. When a PIN diode attenuator is used for forming low power levels, a control loop is not needed in controlling them because the attenuation of the PIN diode attenuator remains constant independent of the temperature if the control current of the attenuator passing through the diodes remains constant. Therefore, when low power levels are formed, no power detector is needed.

As regards its properties, the production method of low power levels of the invention is very simple and the circuit in implementing it is also simple and inexpensive. In forming low power levels, no power control loop is needed, and the power levels remain stable. When said levels are produced, the power amplifier is not given any control, nor does it consume any power then. Since the power detector is used only in connection with forming high power levels, it is not required to have a wide dynamic range.

The invention enables practical implementation of several different circuits. After the power divider, in the branch of the PIN diode attenuator, an amplifier stage may be used if needed, and it may be positioned either in front of the attenuator or thereafter. The PIN diode attenuator may be substituted by a controllable voltage or current controlled amplifier, though in this case, the power control range remains narrower and the temperature stability of the power levels is impaired. In order to block the entry of a RF signal leaking through the amplifier into the antenna coupling when the transmitter must not be switched on, separate diode switches may be placed in the signal path passing through the RF signal amplifier or in the signal path passing through the attenuator.

we claim:

1. A circuit for forming lower power levels in a transmitter of a radio telephone, in which a radio frequency signal (RF signal) is conducted through an amplifier stage to an output of the transmitter, comprising:
    a source divider for dividing the RF signal which is before the amplifier stage (1) into two branches;
    means for forming high power levels by conducting in one of the branches the RF signal into said amplifier stage (1) by which the high power levels are formed;
    means for forming low power levels by conducting in the other of the branches the RF signal to an element (b) by which the low power levels are produced; and
    means for combining said branches in the output (RFout) of the transmitter, the high power levels each having a magnitude greater than each of the low power levels, each of the means for forming high power levels and the means for forming low power levels receiving respective control signals derived from control logic of the radio telephone so as to allow the means for forming low power levels to conduct the RF signal to the element and thereby bypass the amplifier stage when low power levels are desired and so as to allow the means for forming high power levels to conduct the RF signal into the amplifier stage when high power levels are desired.

2. A circuit according to claim 1 wherein the element (5) is a PIN diode attenuator, the attenuation of which is controlled by a control voltage (TXC2) derived from the control logic of the radio telephone.

3. A circuit according to claim 1 wherein the element (5) is a gain controlled voltage amplifier which is controlled by a control voltage (TXC2) derived from the control logic of the radio telephone.

4. A circuit according to claim 1, further comprising means for controlling the transmitter by control voltages (TXC1 and TXC2) derived from the control logic of the radio telephone so that during a transmission, the RF signal only proceeds through one branch.

5. A circuit according to claim 1 wherein the means for forming low power levels provides low power levels which are below +13 dBm.

6. A circuit according to claim 1 and in combination with a digital radio telephone system which incorporates the circuit.

7. A circuit according to claim 1, further comprising:
    a control loop which includes the amplifier stage (1), a power detector (2) placed after the amplifier stage, and a reference amplifier (3) between the power detector and the amplifier stage for controlling a gain of the amplifier stage, the reference amplifier receiving input signals derived as voltage from the power detector and derived as control voltage (TXC1) from the control logic of the radio telephone.

8. A circuit according to claim 1, wherein the element (5) is a current controlled amplifier.

9. A circuit according to claim 1, wherein the amplifier stage is a Class-C gain controlled power amplifier.

10. A circuit according to claim 1, further comprising means for blocking entry of the RF signal leaking through the amplifier stage into an antenna coupling when the transmitter is not transmitting.

11. A circuit according to claim 6, wherein the digital radio telephone is a GSM system.

* * * * *